United States Patent
Gealy et al.

(10) Patent No.: US 7,584,942 B2
(45) Date of Patent: Sep. 8, 2009

(54) AMPOULES FOR PRODUCING A REACTION GAS AND SYSTEMS FOR DEPOSITING MATERIALS ONTO MICROFEATURE WORKPIECES IN REACTION CHAMBERS

(75) Inventors: Dan Gealy, Kuna, ID (US); Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 962 days.

(21) Appl. No.: 10/814,573

(22) Filed: Mar. 31, 2004

(65) Prior Publication Data

US 2005/0217575 A1    Oct. 6, 2005

(51) Int. Cl.
*B01F 3/04* (2006.01)
(52) U.S. Cl. .................. 261/77; 261/78.2; 261/111; 261/116; 261/DIG. 65
(58) Field of Classification Search .............. 261/29, 261/30, 35, 36.1, 77, 78.1, 78.2, 111, 116, 261/121.1, DIG. 12, DIG. 65
See application file for complete search history.

(56) References Cited

U.S. PATENT DOCUMENTS

| | | | |
|---|---|---|---|
| 579,269 | A | 3/1897 | Hent |
| 1,741,519 | A * | 12/1929 | Huff .................. 261/114.2 |
| 2,508,500 | A | 5/1950 | de Lange |
| RE24,291 | E * | 3/1957 | Goodyer ............ 184/55.2 |
| 3,522,836 | A | 8/1970 | King |
| 3,618,919 | A | 11/1971 | Beck |
| 3,620,934 | A | 11/1971 | Endle |
| 3,630,769 | A | 12/1971 | Hart et al. |
| 3,630,881 | A | 12/1971 | Lester et al. |
| 3,634,212 | A | 1/1972 | Valayll et al. |
| 3,744,771 | A * | 7/1973 | Deaton ................ 261/78.2 |
| 3,945,804 | A * | 3/1976 | Shang et al. ........... 422/127 |
| 4,018,949 | A | 4/1977 | Donakowski et al. |
| 4,242,182 | A | 12/1980 | Popescu |
| 4,269,625 | A | 5/1981 | Molenaar |
| 4,289,061 | A | 9/1981 | Emmett |

(Continued)

FOREIGN PATENT DOCUMENTS

DE    198 51 824 A1    5/2000

(Continued)

OTHER PUBLICATIONS

Aera Corporation, "Fundamentals of Mass Flow Control," 1 page, retrieved from the internet on Mar. 6, 2003, <http://www.aeramfc.com/funda.shtml>.

(Continued)

*Primary Examiner*—Scott Bushey
(74) *Attorney, Agent, or Firm*—Perkins Coie LLP

(57) ABSTRACT

Ampoules for producing a reaction gas and systems for depositing materials onto microfeature workpieces in reaction chambers are disclosed herein. In one embodiment, an ampoule includes a vessel having an interior volume configured to receive a precursor with a headspace above the precursor. The ampoule further includes a carrier gas inlet for flowing carrier gas into the vessel, a conduit having an opening in the precursor and an outlet in the headspace, and a means for flowing precursor through the conduit and into the headspace to increase the surface area of the precursor exposed to the carrier gas.

17 Claims, 5 Drawing Sheets

U.S. PATENT DOCUMENTS

| | | |
|---|---|---|
| 4,313,783 A | 2/1982 | Davies et al. |
| 4,388,342 A | 6/1983 | Suzuki et al. |
| 4,397,753 A | 8/1983 | Czaja |
| 4,436,674 A | 3/1984 | McMenamin |
| 4,438,724 A | 3/1984 | Doehler et al. |
| 4,469,801 A | 9/1984 | Hirai et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,595,399 A * | 6/1986 | Collins et al. .................. 96/363 |
| 4,681,777 A | 7/1987 | Engelken et al. |
| 4,738,295 A | 4/1988 | Genser |
| 4,780,178 A | 10/1988 | Yoshida et al. |
| 4,826,579 A | 5/1989 | Westfall |
| 4,832,115 A | 5/1989 | Albers et al. |
| 4,871,417 A | 10/1989 | Nishizawa et al. |
| 4,894,132 A | 1/1990 | Tanaka et al. |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,076,205 A | 12/1991 | Vowles et al. |
| 5,090,985 A | 2/1992 | Soubeyrand |
| 5,091,207 A | 2/1992 | Tanaka |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell et al. |
| 5,364,219 A | 11/1994 | Takahashi et al. |
| 5,366,557 A | 11/1994 | Yu |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,474,612 A | 12/1995 | Sato et al. |
| 5,477,623 A | 12/1995 | Tomizawa et al. |
| 5,480,818 A | 1/1996 | Matsumoto et al. |
| 5,496,410 A | 3/1996 | Fukuda et al. |
| 5,498,292 A | 3/1996 | Ozaki |
| 5,500,256 A | 3/1996 | Watabe |
| 5,522,934 A | 6/1996 | Suzuki et al. |
| 5,536,317 A | 7/1996 | Crain et al. |
| 5,562,800 A | 10/1996 | Kawamura |
| 5,575,883 A | 11/1996 | Nishikawa |
| 5,589,002 A | 12/1996 | Su |
| 5,589,110 A | 12/1996 | Motoda et al. |
| 5,592,581 A | 1/1997 | Okase |
| 5,595,606 A | 1/1997 | Fujikawa et al. |
| 5,599,513 A | 2/1997 | Masaki et al. |
| 5,609,798 A * | 3/1997 | Liu et al. .................. 261/78.2 |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,658,503 A * | 8/1997 | Johnston et al. ............ 261/78.2 |
| 5,683,538 A | 11/1997 | O'Neill et al. |
| 5,693,288 A | 12/1997 | Nakamura |
| 5,716,796 A | 2/1998 | Bull et al. |
| 5,729,896 A | 3/1998 | Dalal et al. |
| 5,733,375 A | 3/1998 | Fukuda et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino |
| 5,772,771 A | 6/1998 | Li et al. |
| 5,788,778 A | 8/1998 | Shang et al. |
| 5,792,269 A | 8/1998 | Deacon et al. |
| 5,792,700 A | 8/1998 | Turner et al. |
| 5,803,938 A | 9/1998 | Yamaguchi et al. |
| 5,819,683 A | 10/1998 | Ikeda et al. |
| 5,820,641 A | 10/1998 | Gu et al. |
| 5,820,686 A | 10/1998 | Moore |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,866,986 A | 2/1999 | Pennington |
| 5,868,159 A | 2/1999 | Loan et al. |
| 5,879,459 A | 3/1999 | Gadgil et al. |
| 5,879,516 A | 3/1999 | Kasman |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |
| 5,936,829 A | 8/1999 | Moslehi |
| 5,940,684 A | 8/1999 | Shakuda et al. |
| 5,953,634 A | 9/1999 | Kajita et al. |
| 5,956,613 A | 9/1999 | Zhao et al. |
| 5,958,140 A | 9/1999 | Arami et al. |
| 5,961,775 A | 10/1999 | Fujimura et al. |
| 5,963,336 A | 10/1999 | McAndrew et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 5,998,932 A | 12/1999 | Lenz |
| 6,006,694 A | 12/1999 | DeOrnellas et al. |
| 6,008,086 A | 12/1999 | Schuegraf et al. |
| 6,016,611 A | 1/2000 | White et al. |
| 6,022,483 A | 2/2000 | Aral |
| 6,032,923 A | 3/2000 | Biegelsen et al. |
| 6,039,557 A | 3/2000 | Unger et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,090,210 A | 7/2000 | Ballance et al. |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A | 11/2000 | McMillin et al. |
| 6,143,077 A | 11/2000 | Ikeda et al. |
| 6,143,078 A | 11/2000 | Ishikawa et al. |

| | | | | | | |
|---|---|---|---|---|---|---|
| 6,143,659 | A | 11/2000 | Leem | 6,420,742 | B1 | 7/2002 | Ahn et al. |
| 6,144,060 | A | 11/2000 | Park et al. | 6,425,168 | B1 | 7/2002 | Takaku et al. |
| 6,149,123 | A | 11/2000 | Harris et al. | 6,428,859 | B1 | 8/2002 | Chiang et al. |
| 6,159,297 | A | 12/2000 | Herchen et al. | 6,432,256 | B1 | 8/2002 | Raoux |
| 6,159,298 | A | 12/2000 | Saito | 6,432,259 | B1 | 8/2002 | Noorbaksh et al. |
| 6,160,243 | A | 12/2000 | Cozad | 6,432,831 | B2 | 8/2002 | Dhindsa et al. |
| 6,161,500 | A | 12/2000 | Kopacz et al. | 6,435,865 | B1 | 8/2002 | Tseng et al. |
| 6,173,673 | B1 | 1/2001 | Golovato et al. | 6,444,039 | B1 | 9/2002 | Nguyen |
| 6,174,366 | B1 | 1/2001 | Ihantola | 6,450,117 | B1 | 9/2002 | Murugesh et al. |
| 6,174,377 | B1 | 1/2001 | Doering et al. | 6,451,119 | B2 | 9/2002 | Sneh et al. |
| 6,174,809 | B1 | 1/2001 | Kang et al. | 6,458,416 | B1 | 10/2002 | Derderian et al. |
| 6,178,660 | B1 | 1/2001 | Emmi et al. | 6,461,436 | B1 | 10/2002 | Campbell et al. |
| 6,182,603 | B1 | 2/2001 | Shang et al. | 6,461,931 | B1 | 10/2002 | Eldridge |
| 6,183,563 | B1 | 2/2001 | Choi et al. | 6,486,081 | B1 | 11/2002 | Ishikawa et al. |
| 6,190,459 | B1 | 2/2001 | Takeshita et al. | 6,503,330 | B1 | 1/2003 | Sneh et al. |
| 6,192,827 | B1 | 2/2001 | Welch et al. | 6,506,254 | B1 | 1/2003 | Bosch et al. |
| 6,193,802 | B1 | 2/2001 | Pang et al. | 6,508,268 | B1 | 1/2003 | Kouketsu et al. |
| 6,194,628 | B1 | 2/2001 | Pang et al. | 6,509,280 | B2 | 1/2003 | Choi |
| 6,197,119 | B1 | 3/2001 | Dozoretz et al. | 6,534,007 | B1 | 3/2003 | Blonigan et al. |
| 6,199,465 | B1 * | 3/2001 | Hattori .................... 83/22 | 6,534,395 | B2 | 3/2003 | Werkhoven et al. |
| 6,200,415 | B1 | 3/2001 | Maraschin | 6,540,838 | B2 | 4/2003 | Sneh et al. |
| 6,203,613 | B1 | 3/2001 | Gates et al. | 6,541,353 | B1 | 4/2003 | Sandhu et al. |
| 6,206,967 | B1 | 3/2001 | Mak et al. | 6,551,929 | B1 | 4/2003 | Kori et al. |
| 6,206,972 | B1 | 3/2001 | Dunham | 6,562,140 | B1 | 5/2003 | Bondestam et al. |
| 6,207,937 | B1 | 3/2001 | Stoddard et al. | 6,562,141 | B2 | 5/2003 | Clarke |
| 6,210,754 | B1 | 4/2001 | Lu et al. | 6,573,184 | B2 | 6/2003 | Park |
| 6,211,033 | B1 | 4/2001 | Sandhu et al. | 6,579,372 | B2 | 6/2003 | Park |
| 6,211,078 | B1 | 4/2001 | Matthews | 6,579,374 | B2 | 6/2003 | Bondestam et al. |
| 6,214,714 | B1 | 4/2001 | Wang et al. | 6,585,823 | B1 | 7/2003 | Van Wijck |
| 6,237,394 | B1 | 5/2001 | Harris et al. | 6,596,085 | B1 | 7/2003 | Schmitt et al. |
| 6,237,529 | B1 | 5/2001 | Spahn | 6,602,346 | B1 | 8/2003 | Gochberg |
| 6,245,192 | B1 | 6/2001 | Dhindsa et al. | 6,622,104 | B2 | 9/2003 | Wang et al. |
| 6,251,190 | B1 | 6/2001 | Mak et al. | 6,630,201 | B2 | 10/2003 | Chiang et al. |
| 6,255,222 | B1 | 7/2001 | Xia et al. | 6,634,314 | B2 | 10/2003 | Hwang et al. |
| 6,263,829 | B1 | 7/2001 | Schneider et al. | 6,635,965 | B1 | 10/2003 | Lee et al. |
| 6,264,788 | B1 | 7/2001 | Tomoyasu et al. | 6,638,672 | B2 | 10/2003 | Deguchi |
| 6,270,572 | B1 | 8/2001 | Kim et al. | 6,638,879 | B2 | 10/2003 | Hsieh et al. |
| 6,273,954 | B2 | 8/2001 | Nishikawa et al. | 6,641,673 | B2 | 11/2003 | Yang |
| 6,277,763 | B1 | 8/2001 | Kugimiya et al. | 6,663,713 | B1 | 12/2003 | Robles et al. |
| 6,280,584 | B1 | 8/2001 | Kumar et al. | 6,666,982 | B2 | 12/2003 | Brcka |
| 6,287,965 | B1 | 9/2001 | Kang et al. | 6,673,196 | B1 | 1/2004 | Oyabu |
| 6,287,980 | B1 | 9/2001 | Hanazaki et al. | 6,689,220 | B1 | 2/2004 | Nguyen |
| 6,290,491 | B1 | 9/2001 | Shahvandi et al. | 6,704,913 | B2 | 3/2004 | Rossman |
| 6,291,337 | B1 | 9/2001 | Sidhwa | 6,705,345 | B1 | 3/2004 | Bifano |
| 6,294,394 | B1 | 9/2001 | Erickson et al. | 6,706,334 | B1 | 3/2004 | Kobayashi et al. |
| 6,297,539 | B1 | 10/2001 | Ma et al. | 6,734,020 | B2 | 5/2004 | Lu et al. |
| 6,302,964 | B1 | 10/2001 | Umotoy et al. | 6,770,145 | B2 | 8/2004 | Saito |
| 6,302,965 | B1 | 10/2001 | Umotoy et al. | 6,800,139 | B1 | 10/2004 | Shinriki et al. |
| 6,303,953 | B1 | 10/2001 | Doan et al. | 6,807,971 | B2 | 10/2004 | Saito et al. |
| 6,305,314 | B1 | 10/2001 | Sneh et al. | 6,818,249 | B2 | 11/2004 | Derderian |
| 6,309,161 | B1 | 10/2001 | Hofmeister | 6,821,347 | B2 | 11/2004 | Carpenter et al. |
| 6,315,859 | B1 | 11/2001 | Donohoe | 6,830,652 | B1 | 12/2004 | Ohmi et al. |
| 6,328,803 | B2 | 12/2001 | Rolfson et al. | 6,838,114 | B2 | 1/2005 | Carpenter et al. |
| 6,329,297 | B1 | 12/2001 | Balish et al. | 6,845,734 | B2 | 1/2005 | Carpenter et al. |
| 6,333,272 | B1 | 12/2001 | McMillin et al. | 6,849,131 | B2 | 2/2005 | Chen et al. |
| 6,334,928 | B1 | 1/2002 | Sekine et al. | 6,861,094 | B2 | 3/2005 | Derderian et al. |
| 6,342,277 | B1 | 1/2002 | Sherman | 6,861,356 | B2 | 3/2005 | Matsuse et al. |
| 6,346,477 | B1 | 2/2002 | Kaloyeros et al. | 6,877,726 | B1 * | 4/2005 | Rindt et al. .................. 261/111 |
| 6,347,602 | B2 | 2/2002 | Goto et al. | 6,881,295 | B2 | 4/2005 | Nagakura et al. |
| 6,347,918 | B1 | 2/2002 | Blahnik | 6,887,521 | B2 | 5/2005 | Basceri |
| 6,355,561 | B1 | 3/2002 | Sandhu et al. | 6,905,547 | B1 | 6/2005 | Londergan et al. |
| 6,358,323 | B1 | 3/2002 | Schmitt et al. | 6,905,549 | B2 | 6/2005 | Okuda et al. |
| 6,364,219 | B1 | 4/2002 | Zimmerman et al. | 6,955,725 | B2 | 10/2005 | Dando |
| 6,374,831 | B1 | 4/2002 | Chandran et al. | 6,966,936 | B2 | 11/2005 | Yamasaki et al. |
| 6,383,300 | B1 | 5/2002 | Saito et al. | 6,991,684 | B2 | 1/2006 | Kannan et al. |
| 6,387,185 | B2 | 5/2002 | Doering et al. | 7,022,184 | B2 | 4/2006 | Van Wijck et al. |
| 6,387,207 | B1 | 5/2002 | Janakiraman et al. | 7,056,806 | B2 | 6/2006 | Basceri et al. |
| 6,387,324 | B1 * | 5/2002 | Patterson et al. ............... 422/45 | 7,086,410 | B2 | 8/2006 | Chouno et al. |
| 6,402,806 | B1 | 6/2002 | Schmitt et al. | 7,153,396 | B2 | 12/2006 | Genser et al. |
| 6,402,849 | B2 | 6/2002 | Kwag et al. | 2001/0001952 | A1 | 5/2001 | Nishizawa et al. |
| 6,415,736 | B1 | 7/2002 | Hao et al. | 2001/0010309 | A1 | 8/2001 | Van Bilsen |
| 6,419,462 | B1 | 7/2002 | Horie et al. | 2001/0011526 | A1 | 8/2001 | Doering et al. |
| 6,420,230 | B1 | 7/2002 | Derderian et al. | 2001/0012697 | A1 | 8/2001 | Mikata |

| | | | | | | |
|---|---|---|---|---|---|---|
| 2001/0020447 A1 | 9/2001 | Murugesh et al. | | 2004/0083959 A1 | 5/2004 | Carpenter et al. |
| 2001/0024387 A1 | 9/2001 | Raaijmakers et al. | | 2004/0083960 A1 | 5/2004 | Dando |
| 2001/0029892 A1 | 10/2001 | Cook et al. | | 2004/0083961 A1 | 5/2004 | Basceri |
| 2001/0045187 A1 | 11/2001 | Uhlenbrock | | 2004/0089240 A1 | 5/2004 | Dando et al. |
| 2001/0050267 A1 | 12/2001 | Hwang et al. | | 2004/0094095 A1 | 5/2004 | Huang et al. |
| 2001/0054484 A1 | 12/2001 | Komino | | 2004/0099377 A1 | 5/2004 | Newton et al. |
| 2002/0000202 A1 | 1/2002 | Yuda et al. | | 2004/0124131 A1 | 7/2004 | Aitchison et al. |
| 2002/0007790 A1 | 1/2002 | Park | | 2004/0154538 A1 | 8/2004 | Carpenter et al. |
| 2002/0016044 A1 | 2/2002 | Dreybrodt et al. | | 2004/0226507 A1 | 11/2004 | Carpenter et al. |
| 2002/0020353 A1 | 2/2002 | Redemann et al. | | 2004/0226516 A1 | 11/2004 | Daniel et al. |
| 2002/0042205 A1 | 4/2002 | McMillin et al. | | 2004/0238123 A1 | 12/2004 | Becknell et al. |
| 2002/0043216 A1 | 4/2002 | Hwang et al. | | 2005/0016956 A1 | 1/2005 | Liu et al. |
| 2002/0052097 A1 | 5/2002 | Park | | 2005/0016984 A1 | 1/2005 | Dando |
| 2002/0073924 A1 | 6/2002 | Chiang et al. | | 2005/0022739 A1 | 2/2005 | Carpenter et al. |
| 2002/0076490 A1 | 6/2002 | Chiang et al. | | 2005/0028734 A1 | 2/2005 | Carpenter et al. |
| 2002/0076507 A1 | 6/2002 | Chiang et al. | | 2005/0039680 A1 | 2/2005 | Beaman et al. |
| 2002/0076508 A1 | 6/2002 | Chiang et al. | | 2005/0039686 A1 | 2/2005 | Zheng et al. |
| 2002/0088547 A1 | 7/2002 | Tomoyasu et al. | | 2005/0045100 A1 | 3/2005 | Derderian |
| 2002/0094689 A1 | 7/2002 | Park | | 2005/0045102 A1 | 3/2005 | Zheng et al. |
| 2002/0100418 A1 | 8/2002 | Sandhu et al. | | 2005/0048742 A1 | 3/2005 | Dip et al. |
| 2002/0104481 A1 | 8/2002 | Chiang et al. | | 2005/0059261 A1 | 3/2005 | Basceri et al. |
| 2002/0108714 A1 | 8/2002 | Doering et al. | | 2005/0061243 A1 | 3/2005 | Sarigiannis et al. |
| 2002/0110991 A1 | 8/2002 | Li | | 2005/0087132 A1 | 4/2005 | Dickey et al. |
| 2002/0127745 A1 | 9/2002 | Lu et al. | | 2005/0217582 A1 | 10/2005 | Kim et al. |
| 2002/0129768 A1 | 9/2002 | Carpenter et al. | | 2005/0249887 A1 | 11/2005 | Dando et al. |
| 2002/0132374 A1 | 9/2002 | Basceri et al. | | 2006/0115957 A1 | 6/2006 | Basceri et al. |
| 2002/0144655 A1 | 10/2002 | Chiang et al. | | 2006/0121689 A1 | 6/2006 | Basceri et al. |
| 2002/0146512 A1 | 10/2002 | Rossman | | 2006/0165873 A1 | 7/2006 | Rueger et al. |
| 2002/0162506 A1 | 11/2002 | Sneh et al. | | 2006/0198955 A1 | 9/2006 | Zheng et al. |
| 2002/0164420 A1 | 11/2002 | Derderian et al. | | 2006/0204649 A1 | 9/2006 | Beaman et al. |
| 2002/0185067 A1 | 12/2002 | Upham | | 2006/0205187 A1 | 9/2006 | Zheng et al. |
| 2002/0195056 A1 | 12/2002 | Sandhu et al. | | 2006/0213440 A1 | 9/2006 | Zheng et al. |
| 2002/0195145 A1 | 12/2002 | Lowery et al. | | 2006/0237138 A1 | 10/2006 | Qin |
| 2002/0195201 A1 | 12/2002 | Beer | | | | |
| 2002/0197402 A1 | 12/2002 | Chiang et al. | | | FOREIGN PATENT DOCUMENTS | |
| 2003/0000473 A1 | 1/2003 | Chae et al. | | | | |
| 2003/0003697 A1 | 1/2003 | Agarwal et al. | | EP | 1 167 569 A1 | 1/2002 |
| 2003/0003730 A1 | 1/2003 | Li | | JP | 62235728 | 10/1987 |
| 2003/0013320 A1 | 1/2003 | Kim et al. | | JP | 62263629 | 11/1987 |
| 2003/0023338 A1 | 1/2003 | Chin et al. | | JP | 63020490 | 1/1988 |
| 2003/0024477 A1 | 2/2003 | Okuda et al. | | JP | 63111177 | 5/1988 |
| 2003/0027428 A1 | 2/2003 | Ng et al. | | JP | 63234198 | 9/1988 |
| 2003/0027431 A1 | 2/2003 | Sneh et al. | | JP | 63-256460 A | 10/1988 |
| 2003/0031794 A1 | 2/2003 | Tada et al. | | JP | 6481311 | 3/1989 |
| 2003/0037729 A1 | 2/2003 | DeDontney et al. | | JP | 1-273991 A | 11/1989 |
| 2003/0049372 A1 | 3/2003 | Cook et al. | | JP | 03174717 | 7/1991 |
| 2003/0060030 A1 | 3/2003 | Lee et al. | | JP | 4-100533 A | 4/1992 |
| 2003/0066483 A1 | 4/2003 | Lee et al. | | JP | 4-213818 A | 8/1992 |
| 2003/0070609 A1 | 4/2003 | Campbell et al. | | JP | 6054443 | 2/1994 |
| 2003/0070617 A1 | 4/2003 | Kim et al. | | JP | 6-151558 A | 5/1994 |
| 2003/0070618 A1 | 4/2003 | Campbell et al. | | JP | 06201539 | 7/1994 |
| 2003/0075273 A1 | 4/2003 | Kilpela et al. | | JP | 06202372 | 7/1994 |
| 2003/0079686 A1 | 5/2003 | Chen et al. | | JP | 6-342785 A | 12/1994 |
| 2003/0094903 A1 | 5/2003 | Tao et al. | | JP | 8-34678 A | 2/1996 |
| 2003/0098372 A1 | 5/2003 | Kim | | JP | 9-82650 A | 3/1997 |
| 2003/0098419 A1 | 5/2003 | Ji et al. | | JP | 10008255 | 1/1998 |
| 2003/0106490 A1 | 6/2003 | Jallepally et al. | | JP | 10-223719 A | 8/1998 |
| 2003/0121608 A1 | 7/2003 | Chen et al. | | JP | 11-172438 A | 6/1999 |
| 2003/0159780 A1 | 8/2003 | Carpenter et al. | | JP | 2001-82682 A | 3/2001 |
| 2003/0185979 A1 | 10/2003 | Nelson | | JP | 2001-261375 A | 9/2001 |
| 2003/0192645 A1 | 10/2003 | Liu | | JP | 2002-164336 A | 6/2002 |
| 2003/0194862 A1 | 10/2003 | Mardian et al. | | JP | 2001-254181 A | 9/2002 |
| 2003/0200926 A1 | 10/2003 | Dando et al. | | SU | 598630 | 3/1978 |
| 2003/0203109 A1 | 10/2003 | Dando et al. | | WO | WO-98/37258 A1 | 8/1998 |
| 2003/0213435 A1 | 11/2003 | Okuda et al. | | WO | WO-99/06610 A1 | 2/1999 |
| 2003/0232892 A1 | 12/2003 | Guerra-Santos et al. | | WO | WO-00/40772 A1 | 7/2000 |
| 2004/0000270 A1 | 1/2004 | Carpenter et al. | | WO | WO-00/63952 A1 | 10/2000 |
| 2004/0003777 A1 | 1/2004 | Carpenter et al. | | WO | WO-00/65649 A1 | 11/2000 |
| 2004/0007188 A1 | 1/2004 | Burkhart et al. | | WO | WO-00/79019 A | 12/2000 |
| 2004/0025786 A1 | 2/2004 | Kontani et al. | | WO | WO-0132966 | 5/2001 |
| 2004/0035358 A1 | 2/2004 | Basceri et al. | | WO | WO-01/46490 A1 | 6/2001 |
| 2004/0040502 A1 | 3/2004 | Basceri et al. | | WO | WO-02/45871 A1 | 6/2002 |
| 2004/0040503 A1 | 3/2004 | Basceri et al. | | WO | WO-02/48427 A1 | 6/2002 |

| | | |
|---|---|---|
| WO | WO-02/073329 A2 | 9/2002 |
| WO | WO-02/073660 A2 | 9/2002 |
| WO | WO-02/081771 A2 | 10/2002 |
| WO | WO-02/095807 A2 | 11/2002 |
| WO | WO-03/008662 A2 | 1/2003 |
| WO | WO-03/016587 A1 | 2/2003 |
| WO | WO-03/028069 A2 | 4/2003 |
| WO | WO-03/033762 A1 | 4/2003 |
| WO | WO-03/035927 A2 | 5/2003 |
| WO | WO-03/052807 A1 | 6/2003 |

OTHER PUBLICATIONS

EMCO Flow Systems, "Mach One Mass Flow Controllers", 1 page, retrieved from the internet on Nov. 7, 2003, <http://emcoflow.com/mach-one.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/mach_one_brochure_2_01.pdf>.

MKS Instruments, ASTeX® Microwave Plasma Sources and Subsystems, 1 page, retrieved from the internet on Nov. 19, 2004, <http://www.mksinst.com/PRG2.html>.

MKS Instruments, Data Sheet, Downstream Plasma Source, Type AX7610, 4 pages, Dec. 2002, <http://www.mksinst.com/docs/UR/ASTEXax7610DS.pdf>.

SemiZone, "EMCO Flow Systems Granted Patent for the Mach One Mass Flow Controller for the Semiconductor Industry (Jun. 28, 2001)", 2 pages, <http://www.semizone.com/news/item?news_item_id=100223>.

Integrated Process Systems Ltd., "ALD & CVD", 2 pages, retrieved from the Internet on Dec. 11, 2001, <http://www.ips-tech.com/eng/pro-p2-2.htm>.

Deublin Company, "Rotating Unions", 1 page, retrieved from the Internet on Feb. 4, 2002, <http://www.com/products/rotatingunions.htm>.

Cameron, I., "Atomic Layer Deposition Chamber Works at Low Temperatures", 2 pages, Electronic Times, Jul. 19, 2001, <http://www.electronictimes.com/story/OEG20010719S0042>.

Cutting Edge Optronics, 600W QCW Laser Diode Array, Part No. ARR48P600, 2 pages, Oct. 2001, <www.ceolaser.com>.

Henning, A.K., et al., "Microfluidic MEMS for Semiconductor Processing," IEEE Trans. Components, Packaging, and Manufacturing Technology B21, pp. 329-337, 1998.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K., "Liquid and gas-liquid phase behavior in thermonpneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Maillefer, D., et al., "A High-Performance Silicon Micropump for Disposable Drug Delivery Systems," pp. 413-417, IEEE, 2001.

Henning, A.K., et al., "A thermopneumatically actuated microvalve for liquid expansion and proportional control", Proceedings, Transducers '97: 1997 International Solid State Sensors and Actuators Conference, pp. 825-828.

University of California, Berkeley, University Extension, "Atomic Layer Deposition," 5 pages, Sep. 24-25, 2001, <http://www.unex.berkeley,edu/eng/br225/1-1.html>.

Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.

Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.

Ready, J.F., "Effects Due to Absorption of Laser Radiation," Journal of Applied Physics, vol. 36, No. 2, pp. 462-468, Feb. 1965, Journal of Applied Physics, American Institute of Physics.

Zare, R.N., et al. "Mass Spectrometry of Molecular Adsorbates Using Laser Desorption/Laser Multiphoton Ionization," Bulletin of the Chemicsl Society of Japan, vol. 61, No. 1, pp. 87-92, Jan. 1988.

Tokyo Electron Limited, Plasma Process System, Trias SPA, 1 page, retrieved from the Internet on Oct. 16, 2004, <http://www.tel.com/eng/products/spe/sdtriasspa.html>.

Olsson, A., "Valve-less Diffuser Micropumps", ISSN 0281-2878, 66 pages, 1998.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Henning, A.K. et al., "Contamination Reduction Using MEMS-Based, High-Precision Mass Flow Controllers," Proceedings, SEMICON West Symposium on Contamination Free Manuafacturing for Semiconductor Processing (SEMI, Mountain View, CA, 1998), pp. 1-11.

Henning, A.K., "Microfluidic MEMS," Proceedings, IEEE Aerospace Conference, Paper 4.906 (IEEE Press, Piscataway, NJ, 1998), 16 pages.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Deublin Company, "Sealing," 2 pages, retrieved from the Internet on Feb. 4, 2002, <http://www.deublin.com/products/sealing.htm>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

* cited by examiner

AMPOULES FOR PRODUCING A REACTION GAS AND SYSTEMS FOR DEPOSITING MATERIALS ONTO MICROFEATURE WORKPIECES IN REACTION CHAMBERS

TECHNICAL FIELD

The present invention is related to ampoules for producing a reaction gas and systems for depositing materials onto microfeature workpieces in reaction chambers.

BACKGROUND

Thin film deposition techniques are widely used in the manufacturing of microfeatures to form a coating on a workpiece that closely conforms to the surface topography. The size of the individual components in the workpiece is constantly decreasing, and the number of layers in the workpiece is increasing. As a result, both the density of components and the aspect ratios of depressions (i.e., the ratio of the depth to the size of the opening) are increasing. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed while in a gaseous or vaporous state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. Referring to FIG. 1B, the layer of A molecules is then exposed to another precursor gas containing B molecules. The A molecules react with the B molecules to form an extremely thin layer of solid material on the workpiece W. The chamber is then purged again with a purge gas to remove excess B molecules.

FIG. 2 illustrates the stages of one cycle for forming a thin solid layer using ALD techniques. A typical cycle includes (a) exposing the workpiece to the first precursor A, (b) purging excess A molecules, (c) exposing the workpiece to the second precursor B, and then (d) purging excess B molecules. In actual processing, several cycles are repeated to build a thin film on a workpiece having the desired thickness. For example, each cycle may form a layer having a thickness of approximately 0.5-1.0 Å, and thus several cycles are required to form a solid layer having a thickness of approximately 60 Å.

FIG. 3 schematically illustrates an ALD system 1 including a single-wafer reaction chamber 10, a carrier gas supply 30, and an ampoule 60 in fluid communication with the reaction chamber 10 and the carrier gas supply 30. The reaction chamber 10 includes a heater 16 that supports the workpiece W and a gas dispenser 12 that dispenses gases into the reaction chamber 10. The gas dispenser 12 has a plenum 13 in fluid communication with the ampoule 60 and a distributor plate 14 with a plurality of holes 15. In operation, a carrier gas flows from the carrier gas supply 30 into the ampoule 60 and mixes with a precursor 70 to form a reaction gas. The reaction gas flows from the ampoule 60 to the gas dispenser 12 for deposition onto the workpiece W. The heater 16 heats the workpiece W to a desired temperature, and a vacuum 18 maintains a negative pressure in the reaction chamber 10 to draw the reaction gas from the gas dispenser 12 across the workpiece W and then through an outlet of the reaction chamber 10.

One drawback of ALD processing is that it has a relatively low throughput compared to CVD techniques. For example, each A-purge-B-purge cycle can take several seconds. This results in a total process time of several minutes to form a single thin layer of only 60 Å. In contrast to ALD processing, CVD techniques require only about one minute to form a 60 Å thick layer. The low throughput limits the utility of the ALD technology in its current state because ALD may create a bottleneck in the overall manufacturing process.

Another drawback of both ALD and CVD processing is that the precursors must be delivered in a gaseous state. Many potentially useful precursors, including, halides, THDs and DMHDs, are relatively low vapor pressure liquids or solids. It can be difficult to volatilize such precursors at a sufficient rate for a commercially acceptable production throughput. Accordingly, a need exists to improve the process of vaporizing low volatility precursors.

DETAILED DESCRIPTION

A. Overview

Figure 1A:
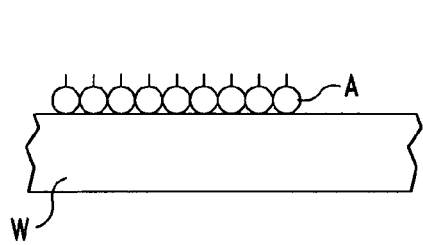
FIGS. 1A and 1B are schematic cross-sectional views of stages in ALD processing in accordance with the prior art.
Figure 1B:
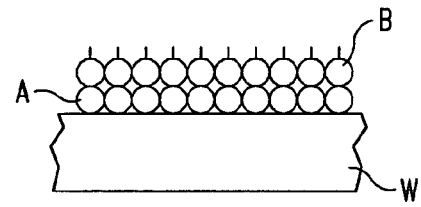
Figure 2:
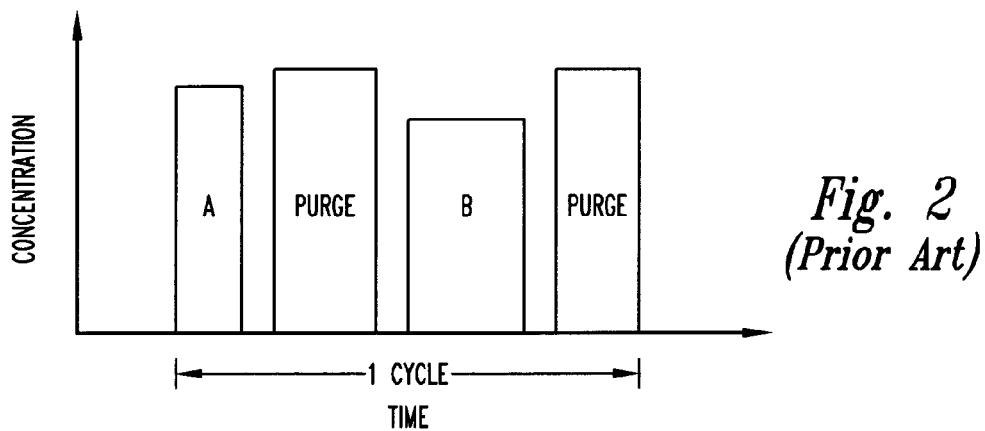
FIG. 2 is a graph illustrating a cycle for forming a layer using ALD techniques in accordance with the prior art.
Figure 3:
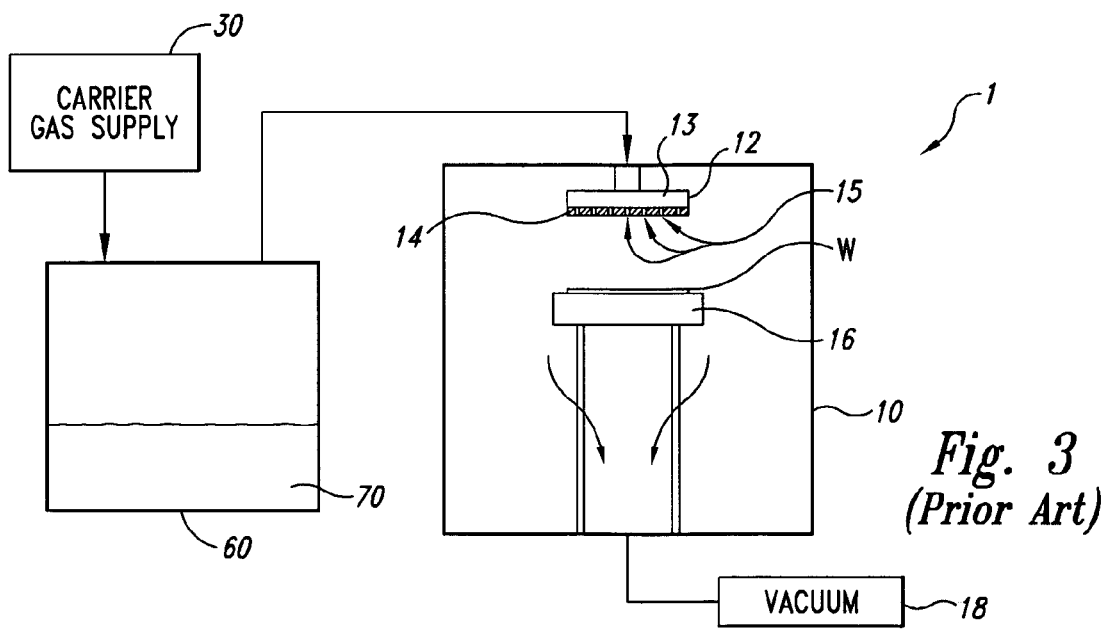
FIG. 3 is a schematic representation of a system including a reaction chamber for depositing materials onto a microfeature workpiece in accordance with the prior art.

The following disclosure describes several embodiments of ampoules for producing a reaction gas and systems for depositing materials onto workpieces in reaction chambers. Many specific details of the invention are described below with reference to single-wafer reaction chambers for depositing materials onto microfeature workpieces, but several embodiments can be used in batch systems for processing a plurality of workpieces simultaneously. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-9 and the following text to provide a thorough understanding of particular embodiments of the invention. A person skilled in the art will understand, however, that the invention may have additional embodiments, or that the invention may be practiced without several of the details of the embodiments shown in FIGS. 4-9.

Several aspects of the invention are directed to ampoules for producing a reaction gas for processing microfeature workpieces in a reaction chamber. In one embodiment, an ampoule includes a vessel having an interior volume configured to receive a precursor with a headspace above the precursor. The ampoule further includes a carrier gas inlet for flowing carrier gas into the vessel, a conduit having an opening in the precursor and an outlet in the headspace, and a flow driver for flowing the precursor through the conduit and into the headspace to increase the surface area of the precursor exposed to the carrier gas. The flow driver can include a pump or a carrier gas line configured to flow carrier gas into the conduit. The carrier gas entrains molecules of the precursor as the carrier gas flows into and through the conduit.

In another embodiment, an ampoule includes a vessel having an interior volume configured to receive a precursor with a headspace above the precursor. The ampoule further includes a conduit for conveying a flow of the precursor to the headspace, a carrier gas inlet for flowing carrier gas into the vessel, and a precursor exposure assembly at least partially within the headspace. The precursor exposure assembly is positioned so that at least some of the nonvaporized precursor flows from the conduit onto the assembly to increase the surface area of the precursor exposed to the carrier gas. The precursor exposure assembly can include a plurality of channels, a conical surface, and/or a plurality of trays arranged in a stack to hold discrete volumes of precursor.

Another aspect of the invention is directed to methods for processing microfeature workpieces in a reaction chamber. In one embodiment, a method includes delivering carrier gas to a vessel having a precursor and a headspace above the precursor, flowing the precursor through a conduit into the headspace to increase the surface area of the precursor exposed to the carrier gas, and removing from the headspace a reaction gas comprised of vaporized precursor. Flowing the precursor through the conduit can include entraining molecules of the precursor in a carrier gas that passes through the conduit. Alternatively, flowing the precursor through the conduit can include pumping the precursor through the conduit with a pump. The method can further include passing the reaction gas from the headspace to the reaction chamber and depositing a reaction product on a surface of the microfeature workpiece. The reaction product can be derived, at least in part, from the vaporized precursor.

Figure 4:
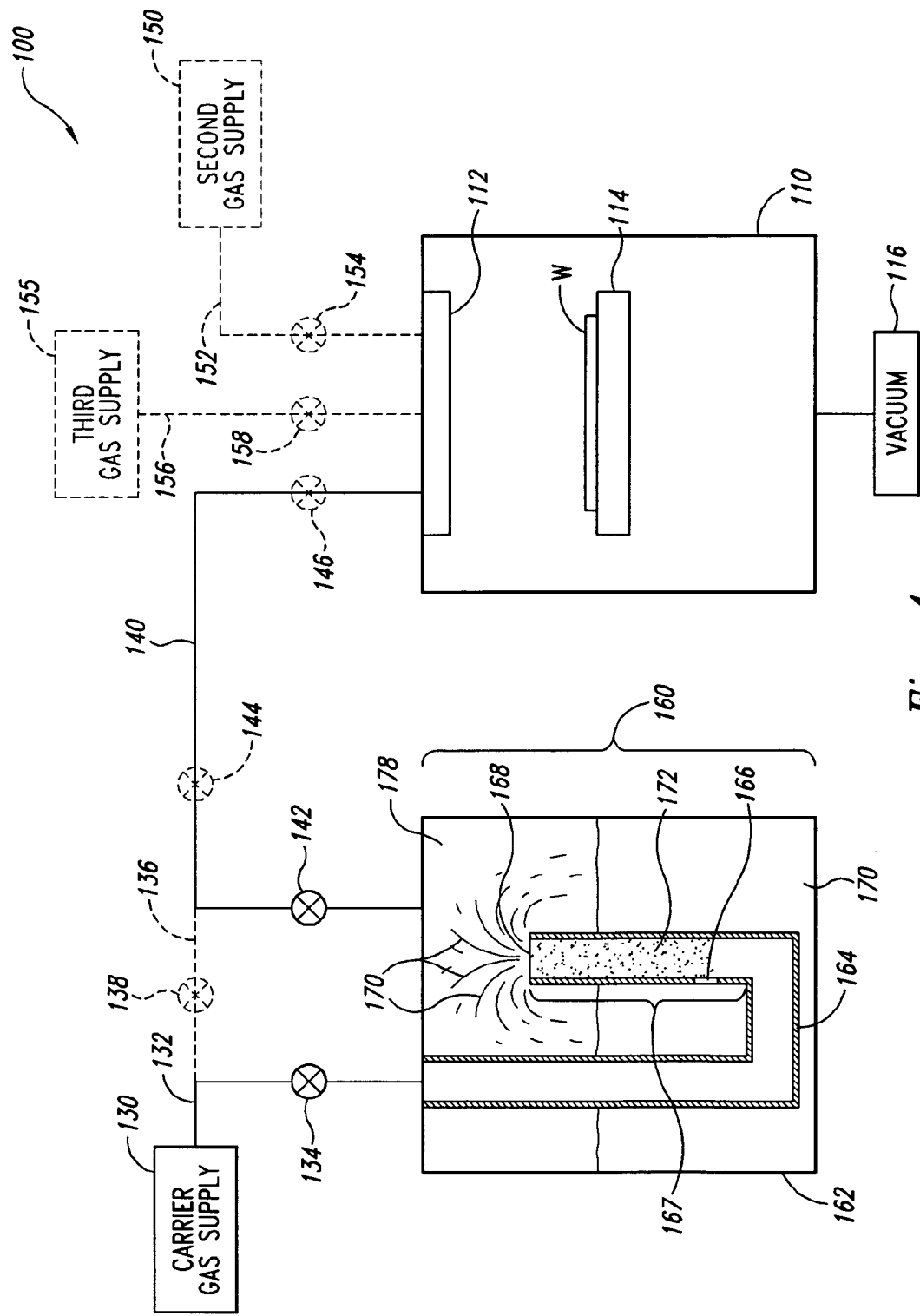
FIG. 4 is a schematic representation of a system for depositing materials onto a microfeature workpiece W in accordance with one embodiment of the invention.

B. Embodiments of Systems for Depositing Materials onto Microfeature Workpieces FIG. 4 is a schematic representation of a system 100 for depositing materials onto a microfeature workpiece W in accordance with one embodiment of the invention. The illustrated system 100 includes a gas phase reaction chamber 110 for receiving the workpiece W, an ampoule 160 for carrying a precursor 170, and a carrier gas supply 130 for providing carrier gas to the ampoule 160 to facilitate transport of the precursor 170 to the reaction chamber 110. The carrier gas mixes with precursor 170 in the ampoule 160 to form a reaction gas. The reaction gas is delivered to the reaction chamber 110 and deposits a layer of material onto the surface of the workpiece W.

The illustrated system 100 further includes a carrier gas supply line 132 to convey the flow of carrier gas to the ampoule 160, and a reaction gas delivery line 140 to convey the flow of reaction gas from the ampoule 160 to the reaction chamber 110. Gas flow through the supply line 132 and the delivery line 140 can be regulated by one or more valves. For example, the gas flow can be regulated by an ampoule inlet valve 134, an ampoule outlet valve 142, a delivery line valve 144 (shown in hidden lines), and a chamber inlet valve 146 (shown in hidden lines). Optionally, a bypass line 136 (shown in hidden lines) with a valve 138 (shown in hidden lines) may deliver carrier gas directly from the supply line 132 to the delivery line 140 to control the concentration of the vaporized precursor in the reaction gas.

In some circumstances, more than one precursor may be necessary to deposit the desired reaction product on the workpiece W. A second precursor and a purge gas, for example, may be delivered from a second gas supply 150 (shown schematically and in hidden lines) and a third gas supply 155 (shown schematically and in hidden lines), respectively. The second gas supply 150 can be coupled to the reaction chamber 110 via a delivery line 152 (shown in hidden lines) having a valve 154 (shown in hidden lines) to control the flow of the second precursor, and the third gas supply 155 can be coupled to the reaction chamber 110 via a delivery line 156 (shown in hidden lines) having a valve 158 (shown in hidden lines) to control the flow of the purge gas. The first and second precursors can be the gas and/or vapor phase constituents that react to form the thin, solid layer on the workpiece W. The purge gas can be a suitable type of gas that is compatible with the reaction chamber 110 and the workpiece W. In other embodiments, the system 100 can include a different number of gas sources for applications that require additional precursors or purge gases.

The illustrated reaction chamber 110 includes a gas dispenser 112 to flow the gas(es) onto the workpiece W and a workpiece support 114 to hold the workpiece W. The workpiece support 114 can be heated to bring the workpiece W to a desired temperature for catalyzing the reaction between the first and second precursors at the surface of the workpiece W. For example, the workpiece support 114 can be a plate with a heating element. The workpiece support 114, however, may not be heated in other applications. A vacuum 116 (shown schematically) maintains negative pressure in the reaction chamber 110 to draw the gas(es) from the gas dispenser 112 across the workpiece W and then through an outlet of the reaction chamber 110.

The illustrated ampoule 160 includes a vessel 162 having an interior volume configured to receive the precursor 170 with a headspace 178 above the precursor 170. The vessel 162 should be made of a material that is relatively inert with respect to the precursor 170 such that contact between the precursor 170 and the interior surface of the vessel 162 does not unduly degrade the vessel 162 or contaminate the precursor 170. Moreover, the material of the vessel 162 should also be selected to withstand the rigors of use, which may include elevated processing temperatures, corrosive fluids, and/or friction with an abrasive particulate precursor. Suitable materials for forming the vessel 162 can include ceramics, glass, and metals such as stainless steel.

The illustrated ampoule 160 further includes a gas conduit 164 in fluid communication with the supply line 132 to convey a flow of carrier gas within the vessel 162. The gas conduit 164 has an opening 166 in the precursor 170 and an outlet 168 in the headspace 178. The opening 166 is sized and positioned so that precursor 170 flows into the gas conduit 164 and becomes entrained in the carrier gas as the carrier gas flows through the conduit 164. Because the mixture of carrier gas and entrained precursor 172 is less dense than the liquid precursor 170, the entrained precursor 172 flows up the gas conduit 164 and through the outlet 168. As such, the portion of the gas conduit 164 between the opening 166 and the outlet 168 defines a lift tube 167 to convey a flow of entrained precursor 172 to the headspace 178. The lift tube 167 can have a hollow circular, rectangular, triangular, or other suitable cross-sectional configuration to convey the flow of entrained precursor 172.

In the lift tube 167, some of the entrained precursor 172 vaporizes as the precursor 172 is exposed to the carrier gas. The vaporized precursor is subsequently removed from the headspace 178 via the gas delivery line 140. The nonvaporized precursor 170 flows from the outlet 168 and back toward the precursor 170 at the base of the vessel 162. Additional amounts of the precursor 170 vaporize in the headspace 178 because the nonvaporized precursor 170 flowing between the outlet 168 and the liquid precursor 170 at the base of the vessel 162 is exposed to the carrier gas. As such, the precursor 170 is exposed to the carrier gas in the lift tube 167, at the surface of the liquid precursor 170, and in the external flow from the outlet 168 of the lift tube 167.

One feature of the ampoule 160 illustrated in FIG. 4 is that the lift tube 167 increases the surface area of the precursor exposed to the carrier gas. Because the precursor is exposed to the carrier gas as the precursor flows through the lift tube 167 and from the outlet 168 toward the base of the vessel 162, the surface area of the precursor exposed to the carrier gas is greater than the transverse cross-sectional area of the vessel 162. An advantage of this feature is that the vaporization rate of the precursor in the vessel 162 is increased because the vaporization rate is generally proportional to the exposed surface area of the precursor. As such, certain low volatility precursors that do not vaporize in prior art ampoules at a sufficient rate for a commercially acceptable production throughput may vaporize at commercially acceptable rates in the ampoule 160 illustrated in FIG. 4.

Another feature of the ampoule 160 illustrated in FIG. 4 is that the vaporization rate of the precursor is increased without increasing the flow rate of the carrier gas. An advantage of this feature is that the vaporization rate of the precursor is increased without reducing the concentration of precursor in the carrier gas.

C. Additional Embodiments of Ampoules for Use in Deposition Systems

Figure 5:
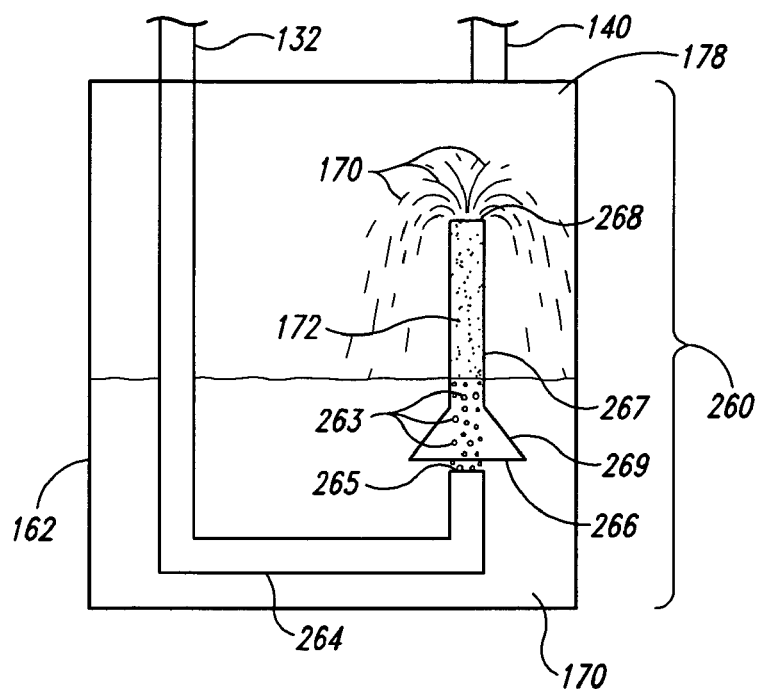
FIG. 5 is a schematic representation of an ampoule for use in processing microfeature workpieces in accordance with another embodiment of the invention.

FIG. 5 is a schematic representation of an ampoule 260 for use in processing microfeature workpieces in accordance with another embodiment of the invention. The illustrated ampoule 260 is generally similar to the ampoule 160 described above with reference to FIG. 4. The illustrated ampoule 260, however, includes a gas conduit 264 and a discrete lift tube 267 spaced apart from the gas conduit 264. The gas conduit 264 includes an outlet 265, and the lift tube 267 includes an opening 266 in the precursor 170 and an outlet 268 in the headspace 178. The lift tube 267 may also include a tapered portion 269 at the opening 266 so that the cross-sectional area of the opening 266 is greater than the cross-sectional area of the outlet 268.

The opening 266 of the lift tube 267 and the outlet 265 of the gas conduit 264 are positioned relative to each other so that carrier gas 263 flows from the outlet 265 into the lift tube 267. The carrier gas 263 entrains precursor 172 as the gas 263 flows through the lift tube 267, and some of the entrained precursor 172 vaporizes in the lift tube 267. Some of the nonvaporized precursor 170 may also vaporize as the precursor 170 flows from the outlet 268 of the lift tube 267 toward the liquid precursor 170 at the base of the vessel 162. As such, the illustrated lift tube 267 increases the surface area of the precursor exposed to carrier gas so that the ampoule 260 advantageously increases the vaporization rate of the precursor.

Figure 6:
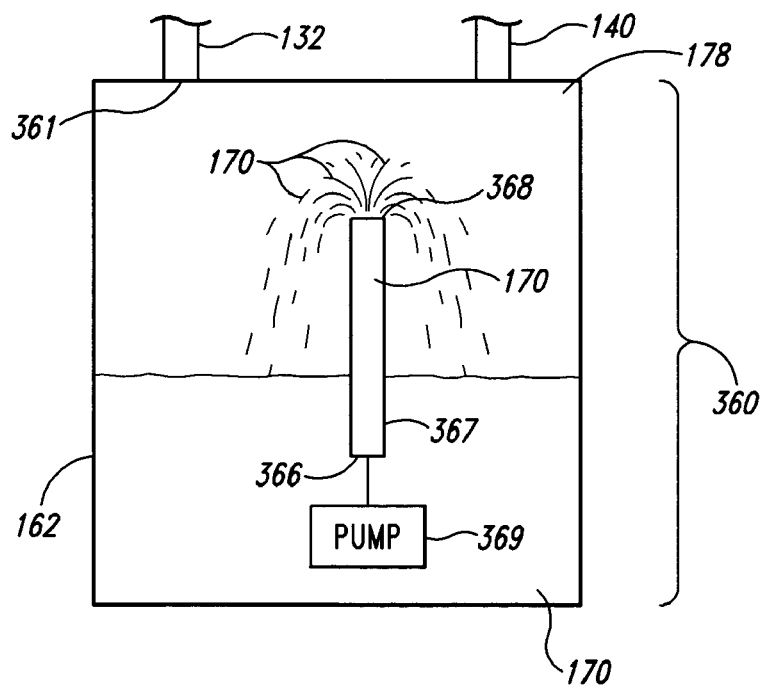
FIG. 6 is a schematic representation of an ampoule for use in processing microfeature workpieces in accordance with another embodiment of the invention.

FIG. 6 is a schematic representation of an ampoule 360 for use in processing microfeature workpieces in accordance with another embodiment of the invention. The illustrated ampoule 360 is generally similar to the ampoule 260 described above with reference to FIG. 5. For example, the ampoule 360 includes a lift tube 367 with an opening 366 in the precursor 170 and an outlet 368 in the headspace 178. The illustrated ampoule 360, however, does not entrain precursor in a flow of carrier gas passing through the lift tube. Rather, the ampoule 360 includes a pump 369 (shown schematically) to flow the precursor 170 through the lift tube 367 and into the headspace 178. The pump 369 can be submerged in the precursor 170, positioned in the headspace 178, or located at another suitable position to flow precursor 170 through the lift tube 367. In the headspace 178, the precursor 170 is exposed to carrier gas, which is delivered to the vessel 162 via a carrier gas inlet 361. Exposure to the carrier gas causes some of the precursor 170 to vaporize. The nonvaporized precursor 170 flows back toward the liquid precursor 170 at the base of the vessel 162 for recirculation through the lift tube 367. As such, the illustrated ampoule 360 increases the surface area of the precursor 170 exposed to the carrier gas and, consequently, the vaporization rate of the precursor 170.

Figure 7:
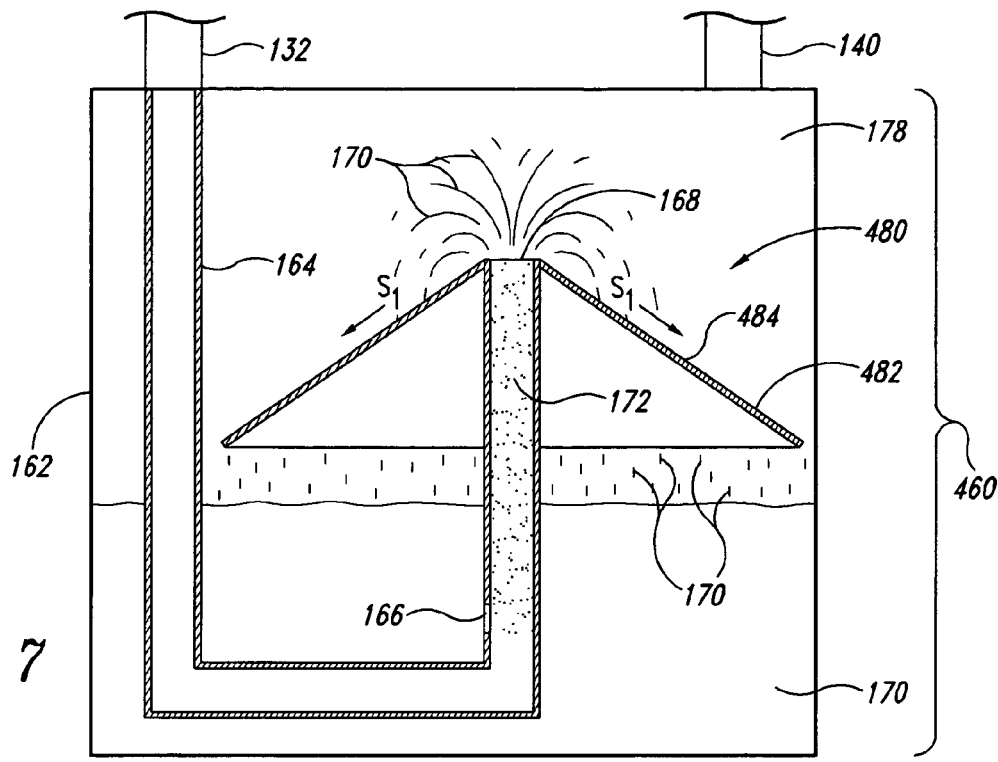
FIG. 7 is a schematic representation of an ampoule for use in processing microfeature workpieces in accordance with another embodiment of the invention.

FIG. 7 is a schematic representation of an ampoule 460 for use in processing microfeature workpieces in accordance with another embodiment of the invention. The illustrated ampoule 460 is generally similar to the ampoule 160 described above with reference to FIG. 4. The illustrated ampoule 460, however, further includes a precursor exposure assembly 480 for increasing the surface area of the precursor 170 exposed to the carrier gas. The illustrated precursor exposure assembly 480 includes a conical member 482 having a surface 484 positioned proximate to the outlet 168 of the gas conduit 164 so that the nonvaporized precursor 170 falls onto the surface 484 after exiting the outlet 168. The slope of the conical member 482 conveys the flow of nonvaporized precursor 170 across the surface 484 in a direction $S_1$. While the nonvaporized precursor 170 flows across the surface 484, the precursor 170 is exposed to the carrier gas in the headspace 178 and, consequently, some of the precursor 170 vaporizes. One advantage of the ampoule 460 illustrated in FIG. 7 is that the precursor exposure assembly 480 increases the vaporization rate of the precursor 170 by increasing the exposure of the precursor 170 to the carrier gas.

Figure 8A:
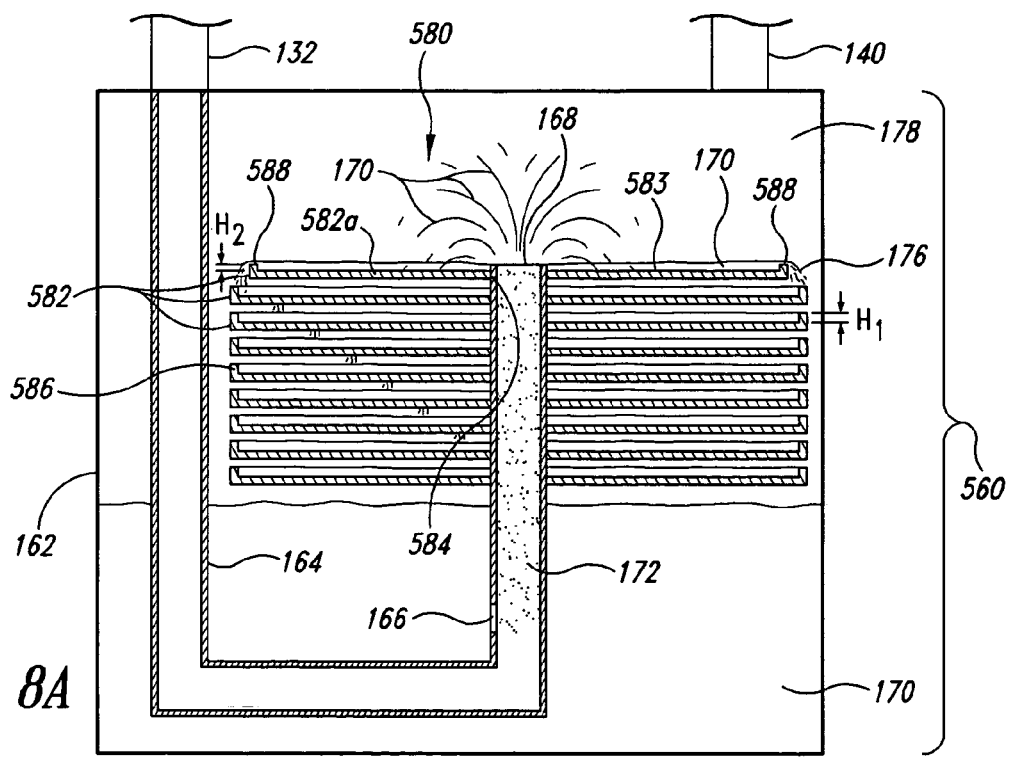
FIG. 8A is a schematic representation of an ampoule for use in processing microfeature workpieces in accordance with another embodiment of the invention.

FIG. 8A is a schematic representation of an ampoule 560 for use in processing microfeature workpieces in accordance with another embodiment of the invention. The illustrated ampoule 560 is generally similar to the ampoule 160 described above with reference to FIG. 4. The illustrated ampoule 560, however, includes a precursor exposure assembly 580 for increasing the surface area of the precursor 170 exposed to the carrier gas. The illustrated precursor exposure assembly 580 includes a plurality of trays 582 arranged in a stack and positioned proximate to the outlet 168 of the gas conduit 164. The trays 582 hold discrete volumes of precursor 170 to increase the surface area of the precursor 170 exposed to the carrier gas. In the illustrated embodiment, the nonvaporized precursor 170 flows from the outlet 168 of the gas conduit 164 and into a top tray 582a. As described in detail below, the individual trays 582 are configured so that cascading flows 176 of precursor 170 pass downward from one tray 582 to an adjacent tray 582. In other embodiments, the gas conduit 164 can include a plurality of holes to flow nonvaporized precursor 170 directly into the individual trays 582 in lieu of or in addition to the flow from the outlet 168 to the top tray 582a.

Figure 8B:
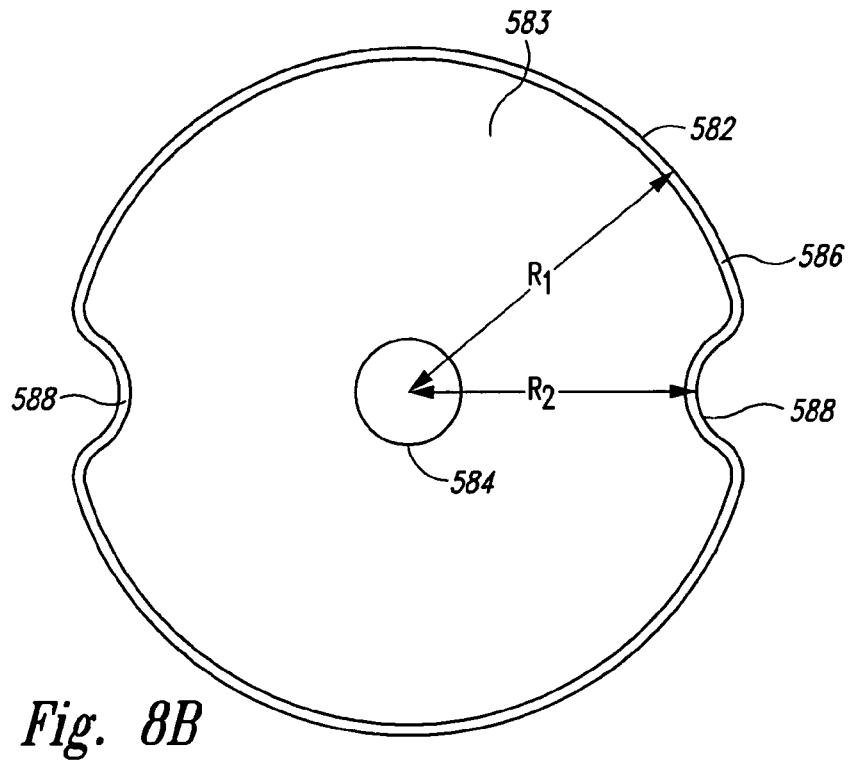
FIG. 8B is a top plan view of one of the trays in the precursor exposure assembly of FIG. 8A.

FIG. 8B is a top plan view of one of the trays 582 of the precursor exposure assembly 580 of FIG. 8A without the precursor 170. Referring to both FIGS. 8A and 8B, the illustrated trays 582 include a support surface 583, a hole 584 in the support surface 583, and an outer wall 586 projecting from the support surface 583. The hole 584 is sized to receive the gas conduit 164 (FIG. 8A) so that the trays 582 can be arranged around the conduit 164. The outer wall 586 and the support surface 583 define an interior region configured to carry the nonvaporized precursor 170. The trays 582 can also include a plurality of notches 588 in the outer wall 586 through which the nonvaporized precursor 170 flows to an adjacent tray 582. More specifically, the outer wall 586 has a height $H_1$ (FIG. 8A) and is positioned at a radius $R_1$ (FIG. 8B) on the trays 582. The notches 588 have a height $H_2$ (FIG. 8A) and are positioned at a radius $R_2$ (FIG. 8B) less than the radius $R_1$. The trays 582 can be arranged with the notches 588 on adjacent trays 582 offset from each other so that the nonvaporized precursor 170 can flow downwardly into the adjacent tray 582. In additional embodiments, the precursor exposure assembly 580 can have other configurations. For example, the trays 582 may not include notches 588, and/or the individual trays may have different diameters. Moreover, the gas conduit 164 can be positioned to flow nonvaporized precursor 170 into the trays 582 without extending through the center of the tray stack.

One feature of the ampoule 560 illustrated in FIGS. 8A and 8B is that the trays 582 of the precursor exposure assembly 580 carry discrete volumes of precursor 170. An advantage of this feature is that the vaporization rate of the precursor 170 is increased due to the large surface area of the precursor 170 exposed to the carrier gas. Moreover, the trays 582 provide a relatively constant surface area that helps stabilize the vaporization rate of the precursor 170 and lends greater control to the concentration of the vaporized precursor 170 in the reaction gas extracted from the vessel 162.

Figure 9:
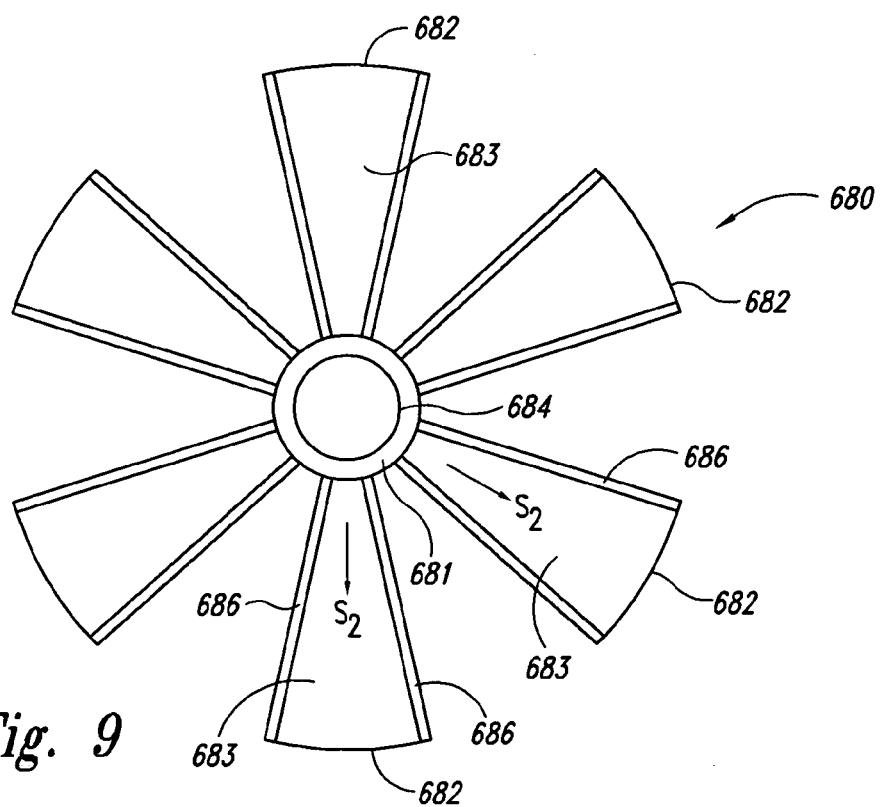
FIG. 9 is a top plan view of a precursor exposure assembly for use in an ampoule in accordance with another embodiment of the invention.

FIG. 9 is a top plan view of a precursor exposure assembly 680 for use in an ampoule in accordance with another embodiment of the invention. The illustrated precursor exposure assembly 680 includes a central member 681 and a plurality of channels 682 projecting radially outward from the central member 681. The central member 681 includes a hole 684 sized to receive a gas conduit so that the channels 682 can be positioned around the outlet of the gas conduit. The channels 682 can project radially outward and generally normal to the gas conduit, or alternatively, the channels 682 can project radially outward and downward toward the precursor at the base of the vessel. In either case, the channels 682 are configured to receive some of the nonvaporized precursor as it flows from the gas conduit to increase the surface area of the nonvaporized precursor exposed to the carrier gas. The channels 682 can include a support surface 683 and sidewalls 686 projecting from the support surface 683. The sidewalls 686 ensure that the nonvaporized precursor flows across the support surface 683 in a direction $S_2$ so that the surface area of the precursor exposed to the carrier gas is predictable and consistent over time. In additional embodiments, the channels 682 may not have sidewalls 686 or may have other configurations.

From the foregoing, it will be appreciated that specific embodiments of the invention have been described herein for purposes of illustration, but that various modifications may be made without deviating from the spirit and scope of the invention. For example, any of the precursor exposure assemblies illustrated in FIGS. 7-9 can be used with any of the ampoules illustrated in FIGS. 4-6. Accordingly, the invention is not limited except as by the appended claims.

We claim:

1. An ampoule for producing a reaction gas for processing a microfeature workpiece in a reaction chamber, the ampoule comprising:
   a vessel including an interior volume having a precursor region configured to receive a precursor and a headspace above the precursor region;
   a conduit in the vessel, the conduit having a first portion in the precursor region, a second portion in the headspace, an opening in the first portion positioned to be in the precursor, and an outlet in the second portion positioned to be in the headspace;
   a flow driver for flowing precursor through the conduit and into the headspace; and
   a precursor exposure assembly at least partially within the headspace, the precursor exposure assembly including a plurality of trays configured in a stack and positioned so that at least some nonvaporized precursor flows from the conduit into at least one of the trays to increase the surface area of the precursor exposed to a carrier gas.

2. The ampoule of claim 1 wherein:
   the conduit comprises a lift tube having the opening and the outlet; and
   the flow driver comprises a carrier gas conduit positioned relative to the lift tube to flow carrier gas into the lift tube via the opening and entrain precursor in the carrier gas.

3. The ampoule of claim 1, wherein the plurality of trays have at least approximately the same cross-sectional dimension and a plurality of notches so that precursor flows downward from one tray to an adjacent tray, the trays being configured to carry discrete volumes of precursor to increase the surface area of the precursor exposed to the carrier gas.

4. An ampoule for producing a reaction gas for processing a microfeature workpiece in a reaction chamber, the ampoule comprising:
   a vessel including an interior volume configured to receive a precursor with a headspace above the precursor;
   a carrier gas conduit for conveying a flow of carrier gas in the vessel, the carrier gas conduit having an outlet positioned to be in the headspace and an opening positioned to be in the precursor so that the carrier gas entrains precursor as the carrier gas flows through the conduit; and
   a precursor exposure assembly at least partially within the headspace, the precursor exposure assembly including a plurality of trays configured in a stack and positioned so that at least a portion of the precursor flows from the carrier gas conduit into at least one of the trays to increase the surface area of the precursor exposed to the carrier gas.

5. An ampoule for producing a reaction gas for processing a microfeature workpiece in a reaction chamber, the ampoule comprising:
   a vessel including an interior volume configured to receive a precursor with a headspace above the precursor;
   a first conduit having an opening positioned to be in the precursor and an outlet positioned to be in the headspace;
   a carrier gas conduit for conveying a flow of carrier gas in the vessel, the carrier gas conduit having an outlet positioned relative to the first conduit to flow the carrier gas into the first conduit via the opening and entrain precursor in the carrier gas; and
   a precursor exposure assembly at least partially within the headspace, the precursor exposure assembly including a plurality of trays configured in a stack and positioned so that at least some precursor flows from the first conduit into at least one of the trays to increase the surface area of the precursor exposed to the carrier gas.

6. The ampoule of claim 5, wherein the at least some precursor that flows into at least one of the trays comprises nonvaporized precursor.

7. An ampoule for producing a reaction gas for processing a microfeature workpiece in a reaction chamber, the ampoule comprising:
   a vessel including an interior volume configured to receive a precursor with a headspace above the precursor;
   a conduit for conveying a flow of precursor to the headspace;
   a carrier gas inlet for flowing carrier gas into the vessel; and
   a precursor exposure assembly comprising a plurality of trays configured in a stack at least partially within the headspace and positioned so that at least a portion of the precursor flows from the conduit onto the precursor exposure assembly to increase the surface area of the precursor exposed to the carrier gas.

8. The ampoule of claim 7 wherein:
   the conduit comprises a lift tube having an opening positioned to be in the precursor and an outlet positioned to be in the headspace; and
   the ampoule further comprises a carrier gas conduit coupled to the carrier gas inlet and the lift tube, the carrier gas conduit configured to convey a flow of carrier gas into the lift tube and entrain precursor in the carrier gas.

9. The ampoule of claim 7 wherein:
   the conduit comprises a lift tube having an opening positioned to be in the precursor and an outlet positioned to be in the headspace; and
   the ampoule further comprises a carrier gas conduit coupled to the carrier gas inlet and having an outlet positioned relative to the lift tube to flow carrier gas into the lift tube via the opening and entrain precursor in the carrier gas.

10. An ampoule for producing a reaction gas for processing a microfeature workpiece in a reaction chamber, the ampoule comprising:
    a vessel including an interior volume configured to receive a precursor with a headspace above the precursor;
    a conduit for conveying a flow of precursor into the headspace;
    a flow driver for flowing precursor through the conduit and into the headspace; and
    a precursor exposure assembly at least partially within the headspace, the precursor exposure assembly including a plurality of trays arranged in a stack so that at least some nonvaporized precursor flows from the conduit into at least one of the trays to increase the surface area of the precursor exposed to a carrier gas.

11. The ampoule of claim 10 wherein:
    the conduit comprises an opening positioned to be in the precursor and an outlet positioned to be in the headspace; and
    the flow driver comprises a carrier gas conduit positioned relative to the conduit to flow carrier gas into the conduit via the opening and entrain precursor in the carrier gas.

12. A system for depositing materials onto a microfeature workpiece in a reaction chamber, the system comprising:
    a vessel including an interior volume configured to receive a precursor with a headspace above the precursor;
    a carrier gas conduit for conveying a flow of carrier gas in the vessel, the carrier gas conduit having an outlet positioned to be in the headspace and an opening positioned to be in the precursor so that the carrier gas entrains precursor as the carrier gas flows through the conduit;
    a gas delivery line in fluid communication with the headspace;
    a gas phase reaction chamber coupled to the gas delivery line; and
    a plurality of trays positioned at least partially within the headspace, the trays being configured in a stack and arranged so that at least a portion of the precursor flows from the carrier gas conduit into at least one of the trays.

13. A system for depositing materials onto a microfeature workpiece in a reaction chamber, the system comprising:
    a vessel including an interior volume configured to receive a precursor with a headspace above the precursor;
    a carrier gas line for providing carrier gas to the vessel;
    a conduit having an opening positioned to be in the precursor and an outlet positioned to be in the headspace;
    a flow driver for flowing precursor through the conduit and into the headspace;
    a gas delivery line in fluid communication with the headspace;
    a gas phase reaction chamber coupled to the gas delivery line; and
    a plurality of trays positioned at least partially within the headspace and configured such that at least some precursor flows into at least one of the trays to increase the surface area of the precursor exposed to the carrier gas.

14. The system of claim 13 wherein:
    the conduit comprises a lift tube having the opening and the outlet; and
    the flow driver comprises a carrier gas conduit coupled to the carrier gas line and the lift tube, the carrier gas conduit configured to convey a flow of carrier gas into the lift tube and entrain precursor in the carrier gas.

15. The system of claim 13 wherein:
the conduit comprises a lift tube having the opening and the outlet; and
the flow driver comprises a carrier gas conduit coupled to the carrier gas line and having an outlet positioned relative to the lift tube to flow carrier gas into the lift tube via the opening and entrain precursor in the carrier gas.

16. A system for depositing materials onto a microfeature workpiece in a reaction chamber, the system comprising:
a vessel including an interior volume configured to receive a precursor with a headspace above the precursor;
a conduit for conveying a flow of precursor to the headspace;
a carrier gas line for providing carrier gas to the vessel;
a precursor exposure assembly comprising a plurality of trays configured in a stack at least partially within the headspace and positioned so that at least some nonvaporized precursor flows from the conduit onto the precursor exposure assembly to increase the surface area of the precursor exposed to the carrier gas;
a gas delivery line in fluid communication with the headspace; and
a gas phase reaction chamber coupled to the gas delivery line.

17. The system of claim 16 wherein:
the conduit comprises a lift tube having an opening positioned to be in the precursor and an outlet positioned to be in the headspace; and
the system further comprises a carrier gas conduit coupled to the carrier gas line and the lift tube, the carrier gas conduit configured to convey a flow of carrier gas into the lift tube and entrain precursor in the carrier gas.

* * * * *

UNITED STATES PATENT AND TRADEMARK OFFICE
CERTIFICATE OF CORRECTION

PATENT NO. : 7,584,942 B2  Page 1 of 1
APPLICATION NO. : 10/814573
DATED : September 8, 2009
INVENTOR(S) : Dan Gealy et al.

It is certified that error appears in the above-identified patent and that said Letters Patent is hereby corrected as shown below:

In column 8, line 65, in Claim 3, delete "claim 1," and insert -- claim 1 --, therefor.

In column 9, line 39, in Claim 6, delete "claim 5," and insert -- claim 5 --, therefor.

Signed and Sealed this

Twenty-seventh Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,584,942 B2  Page 1 of 1
APPLICATION NO. : 10/814573
DATED : September 8, 2009
INVENTOR(S) : Gealy et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1557 days.

Signed and Sealed this

Fourteenth Day of September, 2010

David J. Kappos
*Director of the United States Patent and Trademark Office*